United States Patent
Restaino et al.

(10) Patent No.: US 6,913,483 B2
(45) Date of Patent: Jul. 5, 2005

(54) CABLE FOR ELECTRONIC BATTERY TESTER

(75) Inventors: Harvey A. Restaino, Palos Park, IL (US); Edward J. Amato, Lockport, IL (US)

(73) Assignee: Midtronics, Inc., Willowbrook, IL (US)

( * ) Notice: Subject to any disclaimer, the term of this patent is extended or adjusted under 35 U.S.C. 154(b) by 137 days.

(21) Appl. No.: 10/601,608

(22) Filed: Jun. 23, 2003

(65) Prior Publication Data

US 2004/0257084 A1 Dec. 23, 2004

(51) Int. Cl.$^7$ .............................................. H01R 11/00
(52) U.S. Cl. ...................................... 439/504; 439/912
(58) Field of Search ................................ 439/502, 503, 439/504, 912; 174/135

(56) References Cited

U.S. PATENT DOCUMENTS

| | | | |
|---|---|---|---|
| 2,000,665 A | 5/1935 | Neal | |
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,652,341 A | 3/1972 | Halsall et al. | 136/176 |
| 3,676,770 A | 7/1972 | Sharaf et al. | 324/29.5 |
| 3,729,989 A | 5/1973 | Little | 73/133 |
| 3,750,011 A | 7/1973 | Kreps | 324/29.5 |
| 3,753,094 A | 8/1973 | Furuishi et al. | 324/29.5 |
| 3,796,124 A | 3/1974 | Crosa | 85/36 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |

(Continued)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| GB | 2 246 916 A | 10/1990 |
| JP | 59-17892 | 1/1984 |
| JP | 59-17893 | 1/1984 |
| JP | 59-17894 | 1/1984 |
| JP | 59017894 | 1/1984 |

(Continued)

OTHER PUBLICATIONS

"Notification of Transmittal of The International Search Report or the Declaration", PCT/US03/07837.

Notification of Transmittal of the International Search Report along with the Search Report for International Application No. PCT/US03/27696, filed Sep. 4, 2003, date of mailing Apr. 15, 2004.

Operator's Manual for "Modular Computer Analyzer," SUN, Model MCA 3000, Table of Contents and pp. 1–1 to 1–2; 2–1 to 2–19; 3–1 to 3–47; 4–1 to 4–27; 5–1 to 5–18; 6–1 to 6–16; 7–1 to 7–9; 8–1 to 8–5; 9–1 to 9–13; 10–1 to 10–10; 11–1 to 11–22; 12–1 to 12–33; 13–1 to 13–2; 14–1 to 14–13 (1991).

(Continued)

Primary Examiner—Khiem Nguyen
(74) Attorney, Agent, or Firm—Westman, Champlin & Kelly, P.A.

(57) ABSTRACT

A battery tester cable for coupling an electronic battery tester to a battery includes first clamp and second clamps to provide a connections to terminals of the battery. Cables extend from the clamps. A moveable cable holding device can be positioned along a length of the cables to secure the cables together.

15 Claims, 2 Drawing Sheets

U.S. PATENT DOCUMENTS

| | | | |
|---|---|---|---|
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,023,882 A | 5/1977 | Pettersson | 339/96 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,056,764 A | 11/1977 | Endo et al. | 320/3 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,160,916 A | 7/1979 | Papasideris | 307/10 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,385,269 A | 5/1983 | Aspinwall et al. | 320/14 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,564,798 A | 1/1986 | Young | 320/6 |
| 4,620,767 A | 11/1986 | Woolf | 339/255 |
| 4,633,418 A | 12/1986 | Bishop | 364/554 |
| 4,659,977 A | 4/1987 | Kissel et al. | 320/64 |
| 4,663,580 A | 5/1987 | Wortman | 320/35 |
| 4,665,370 A | 5/1987 | Holland | 324/426 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A | 8/1987 | Radomski | 320/17 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/22 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/18 |
| 4,881,038 A | 11/1989 | Champlin | 324/426 |
| 4,888,716 A | 12/1989 | Ueno | 364/550 |
| 4,912,416 A | 3/1990 | Champlin | 324/430 |
| 4,913,116 A | 4/1990 | Katogi et al. | 123/425 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,933,845 A | 6/1990 | Hayes | 364/200 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/14 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/21 |
| 5,194,799 A | 3/1993 | Tomantschger | 320/2 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/14 |
| 5,281,919 A | 1/1994 | Palanisamy | 324/427 |
| 5,281,920 A | 1/1994 | Wurst | 324/430 |
| 5,295,078 A | 3/1994 | Stich et al. | 364/483 |
| 5,298,797 A | 3/1994 | Redl | 307/246 |
| 5,300,874 A | 4/1994 | Shimamoto et al. | 320/15 |
| 5,302,902 A | 4/1994 | Groehl | 324/434 |
| 5,313,152 A | 5/1994 | Wozniak et al. | 320/6 |
| 5,315,287 A | 5/1994 | Sol | 340/455 |
| 5,321,626 A | 6/1994 | Palladino | 364/483 |
| 5,321,627 A | 6/1994 | Reher | 364/483 |
| 5,323,337 A | 6/1994 | Wilson et al. | 364/574 |
| 5,325,041 A | 6/1994 | Briggs | 320/44 |
| 5,331,268 A | 7/1994 | Patino et al. | 320/20 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/35 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/35 |
| 5,365,160 A | 11/1994 | Leppo et al. | 320/22 |
| 5,365,453 A | 11/1994 | Startup et al. | 364/481 |
| 5,381,096 A | 1/1995 | Hirzel | 324/427 |
| 5,412,308 A | 5/1995 | Brown | 323/267 |

| | | | |
|---|---|---|---|
| 5,412,323 A | 5/1995 | Kato et al. ............... 324/429 |
| 5,426,371 A | 6/1995 | Salley et al. ............. 324/429 |
| 5,426,416 A | 6/1995 | Jefferies et al. .......... 340/664 |
| 5,432,025 A | 7/1995 | Cox ......................... 429/65 |
| 5,432,426 A | 7/1995 | Yoshida .................... 320/20 |
| 5,434,495 A | 7/1995 | Toko ....................... 320/44 |
| 5,435,185 A | 7/1995 | Eagan ....................... 73/587 |
| 5,442,274 A | 8/1995 | Tamai ...................... 320/23 |
| 5,445,026 A | 8/1995 | Eagan ....................... 73/591 |
| 5,449,996 A | 9/1995 | Matsumoto et al. ......... 320/20 |
| 5,449,997 A | 9/1995 | Gilmore et al. ............ 320/39 |
| 5,451,881 A | 9/1995 | Finger ..................... 324/433 |
| 5,453,027 A | 9/1995 | Buell et al. .............. 439/433 |
| 5,457,377 A | 10/1995 | Jonsson .................... 320/5 |
| 5,469,043 A | 11/1995 | Cherng et al. ............. 320/31 |
| 5,485,090 A | 1/1996 | Stephens ................... 324/433 |
| 5,488,300 A | 1/1996 | Jamieson ................... 324/432 |
| 5,519,383 A | 5/1996 | De La Rosa ............... 340/636 |
| 5,528,148 A | 6/1996 | Rogers ..................... 324/426 |
| 5,537,967 A | 7/1996 | Tashiro et al. ............ 123/792.1 |
| 5,541,489 A | 7/1996 | Dunstan .................... 320/2 |
| 5,546,317 A | 8/1996 | Andrieu .................... 364/481 |
| 5,548,273 A | 8/1996 | Nicol et al. .............. 340/439 |
| 5,550,485 A | 8/1996 | Falk ........................ 324/772 |
| 5,561,380 A | 10/1996 | Sway-Tin et al. ........... 324/509 |
| 5,562,501 A | 10/1996 | Kinoshita et al. .......... 439/852 |
| 5,563,496 A | 10/1996 | McClure .................... 320/48 |
| 5,572,136 A | 11/1996 | Champlin ................... 324/426 |
| 5,574,355 A | 11/1996 | McShane et al. ............ 320/39 |
| 5,583,416 A | 12/1996 | Klang ...................... 320/22 |
| 5,585,728 A | 12/1996 | Champlin ................... 324/427 |
| 5,589,757 A | 12/1996 | Klang ...................... 320/22 |
| 5,592,093 A | 1/1997 | Klingbiel .................. 324/426 |
| 5,596,260 A | 1/1997 | Moravec et al. ............ 320/30 |
| 5,598,098 A | 1/1997 | Champlin ................... 324/430 |
| 5,602,462 A | 2/1997 | Stich et al. .............. 323/258 |
| 5,606,242 A | 2/1997 | Hull et al. ............... 320/48 |
| 5,614,788 A | 3/1997 | Mullins et al. ............ 315/82 |
| 5,621,298 A | 4/1997 | Harvey ..................... 320/5 |
| 5,633,985 A | 5/1997 | Severson et al. ........... 395/2.76 |
| 5,637,978 A | 6/1997 | Kellett et al. ............ 320/2 |
| 5,642,031 A | 6/1997 | Brotto ..................... 320/21 |
| 5,650,937 A | 7/1997 | Bounaga .................... 364/483 |
| 5,652,501 A | 7/1997 | McClure et al. ............ 320/17 |
| 5,653,659 A | 8/1997 | Kunibe et al. ............. 477/111 |
| 5,656,920 A | 8/1997 | Cherng et al. ............. 320/31 |
| 5,661,368 A | 8/1997 | Deol et al. ............... 315/82 |
| 5,675,234 A | 10/1997 | Greene ..................... 320/15 |
| 5,677,077 A | 10/1997 | Faulk ...................... 429/90 |
| 5,699,050 A | 12/1997 | Kanazawa .................. 340/636 |
| 5,701,089 A | 12/1997 | Perkins .................... 327/772 |
| 5,705,929 A | 1/1998 | Caravello et al. .......... 324/430 |
| 5,707,015 A | 1/1998 | Guthrie .................... 241/120 |
| 5,710,503 A | 1/1998 | Sideris et al. ............ 320/6 |
| 5,711,648 A | 1/1998 | Hammerslag ................ 414/786 |
| 5,717,336 A | 2/1998 | Basell et al. ............. 324/430 |
| 5,717,937 A | 2/1998 | Fritz ....................... 395/750.01 |
| 5,739,667 A | 4/1998 | Matsuda et al. ............ 320/5 |
| 5,745,044 A | 4/1998 | Hyatt, Jr. et al. ........ 340/825.31 |
| 5,747,909 A | 5/1998 | Syverson et al. ........... 310/156 |
| 5,747,967 A | 5/1998 | Muljadi et al. ............ 320/39 |
| 5,754,417 A | 5/1998 | Nicollini .................. 363/60 |
| 5,757,192 A | 5/1998 | McShane et al. ............ 324/427 |
| 5,760,587 A | 6/1998 | Harvey ..................... 324/434 |
| 5,772,468 A | 6/1998 | Kowalski et al. ........... 439/506 |
| 5,773,978 A | 6/1998 | Becker ..................... 324/430 |
| 5,780,974 A | 7/1998 | Pabla et al. .............. 315/82 |
| 5,780,980 A | 7/1998 | Naito ...................... 318/139 |
| 5,789,899 A | 8/1998 | van Phuoc et al. .......... 320/30 |
| 5,793,359 A | 8/1998 | Ushikubo ................... 345/169 |
| 5,796,239 A | 8/1998 | van Phuoc et al. .......... 320/107 |
| 5,808,469 A | 9/1998 | Kopera ..................... 324/43.4 |
| 5,818,234 A | 10/1998 | McKinnon .................. 324/433 |
| 5,821,756 A | 10/1998 | McShane et al. ........... 324/430 |
| 5,821,757 A | 10/1998 | Alvarez et al. ............ 324/434 |
| 5,825,174 A | 10/1998 | Parker ..................... 324/106 |
| 5,831,435 A | 11/1998 | Troy ....................... 324/426 |
| 5,850,113 A | 12/1998 | Weimer et al. ............. 307/125 |
| 5,862,515 A | 1/1999 | Kobayashi et al. .......... 702/63 |
| 5,865,638 A | 2/1999 | Trafton .................... 439/288 |
| 5,872,443 A | 2/1999 | Williamson ................. 320/21 |
| 5,872,453 A | 2/1999 | Shimoyama et al. ........ 324/431 |
| 5,895,440 A | 4/1999 | Proctor et al. ............ 702/63 |
| 5,912,534 A | 6/1999 | Benedict ................... 315/82 |
| 5,914,605 A | 6/1999 | Bertness ................... 324/430 |
| 5,927,938 A | 7/1999 | Hammerslag ............... 414/809 |
| 5,929,609 A | 7/1999 | Joy et al. ................. 322/25 |
| 5,939,855 A | 8/1999 | Proctor et al. ............ 320/104 |
| 5,939,861 A | 8/1999 | Joko et al. |
| 5,945,829 A | 8/1999 | Bertness ................... 324/430 |
| 5,951,229 A | 9/1999 | Hammerslag ............... 414/398 |
| 5,961,561 A | 10/1999 | Wakefield, II ............ 701/29 |
| 5,961,604 A | 10/1999 | Anderson et al. .......... 709/229 |
| 5,969,625 A | 10/1999 | Russo ...................... 340/636 |
| 5,978,805 A | 11/1999 | Carson ..................... 707/10 |
| 5,982,138 A | 11/1999 | Krieger .................... 320/105 |
| 6,002,238 A | 12/1999 | Champlin .................. 320/134 |
| 6,005,759 A | 12/1999 | Hart et al. ............... 361/66 |
| 6,008,652 A | 12/1999 | Theofanopoulos et al. . 324/434 |
| 6,009,369 A | 12/1999 | Boisvert et al. ........... 701/99 |
| 6,031,354 A | 2/2000 | Wiley et al. .............. 320/116 |
| 6,031,368 A | 2/2000 | Klippel et al. ............ 324/133 |
| 6,037,751 A | 3/2000 | Klang ...................... 320/160 |
| 6,037,777 A | 3/2000 | Champlin .................. 324/430 |
| 6,037,778 A | 3/2000 | Makhija .................... 324/433 |
| 6,046,514 A | 4/2000 | Rouillard et al. .......... 307/77 |
| 6,051,976 A | 4/2000 | Bertness ................... 324/426 |
| 6,061,638 A | 5/2000 | Joyce ...................... 702/63 |
| 6,064,372 A | 5/2000 | Kahkoska ................... 345/173 |
| 6,072,299 A | 6/2000 | Kurie et al. .............. 320/112 |
| 6,072,300 A | 6/2000 | Tsuji ...................... 320/116 |
| 6,081,098 A | 6/2000 | Bertness et al. ........... 320/134 |
| 6,081,109 A | 6/2000 | Seymour et al. ............ 324/127 |
| 6,091,238 A | 7/2000 | McDermott .............. 324/207.2 |
| 6,091,245 A | 7/2000 | Bertness ................... 324/426 |
| 6,094,033 A | 7/2000 | Ding et al. ............... 320/132 |
| 6,104,167 A | 8/2000 | Bertness et al. ........... 320/132 |
| 6,114,834 A | 9/2000 | Parise ..................... 320/109 |
| 6,137,269 A | 10/2000 | Champlin .................. 320/150 |
| 6,140,797 A | 10/2000 | Dunn ....................... 320/105 |
| 6,144,185 A | 11/2000 | Dougherty et al. ......... 320/132 |
| 6,150,793 A | 11/2000 | Lesesky et al. ............ 320/104 |
| 6,158,000 A | 12/2000 | Collins .................... 713/1 |
| 6,161,640 A | 12/2000 | Yamaguchi ................. 180/65.8 |
| 6,163,156 A | 12/2000 | Bertness ................... 324/426 |
| 6,167,349 A | 12/2000 | Alvarez .................... 702/63 |
| 6,172,483 B1 | 1/2001 | Champlin .................. 320/134 |
| 6,172,505 B1 | 1/2001 | Bertness ................... 324/430 |
| 6,181,545 B1 | 1/2001 | Amatucci et al. .......... 361/502 |
| 6,211,651 B1 | 4/2001 | Nemoto ..................... 320/133 |
| 6,222,342 B1 | 4/2001 | Eggert et al. ............. 320/105 |
| 6,222,369 B1 | 4/2001 | Champlin .................. 324/430 |
| D442,503 S | 5/2001 | Lundbeck et al. .......... D10/77 |
| 6,225,808 B1 | 5/2001 | Varghese et al. ........... 324/426 |
| 6,236,332 B1 | 5/2001 | Conkright et al. ..... 340/825.06 |
| 6,238,253 B1 | 5/2001 | Qualls ..................... 439/759 |
| 6,242,887 B1 | 6/2001 | Burke ...................... 320/104 |
| 6,249,124 B1 | 6/2001 | Bertness ................... 324/426 |
| 6,250,973 B1 | 6/2001 | Lowery et al. ............. 439/763 |
| 6,254,438 B1 | 7/2001 | Gaunt ...................... 439/755 |
| 6,259,170 B1 | 7/2001 | Limoge et al. ............ 307/10.8 |
| 6,259,254 B1 | 7/2001 | Klang ...................... 324/427 |

| | | | |
|---|---|---|---|
| 6,262,563 B1 | 7/2001 | Champlin | 320/134 |
| 6,263,268 B1 | 7/2001 | Nathanson | 701/29 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertess | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |
| 6,526,361 B1 | 2/2003 | Jones et al. | 702/63 |
| 6,531,848 B1 | 3/2003 | Chitsazan et al. | 320/153 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,586,941 B2 | 7/2003 | Bertness et al. | 324/426 |
| 6,597,150 B1 | 7/2003 | Bertness et al. | 320/104 |
| 6,600,815 B1 | 7/2003 | Walding | 379/93.04 |
| 6,618,644 B2 | 9/2003 | Bean | 700/231 |
| 6,628,011 B2 | 9/2003 | Droppo et al. | 307/43 |
| 6,629,054 B2 | 9/2003 | Makhija et al. | 702/113 |
| 6,667,624 B1 | 12/2003 | Raichle et al. | 324/426 |
| 6,679,212 B2 | 1/2004 | Kelling | 123/179.28 |
| 6,777,945 B2 | 8/2004 | Roberts et al. | 324/426 |
| 2002/0010558 A1 | 1/2002 | Bertness et al. | 702/63 |
| 2002/0030495 A1 | 3/2002 | Kechmire | 324/427 |
| 2002/0050163 A1 | 5/2002 | Makhija et al. | 73/116 |
| 2002/0171428 A1 | 11/2002 | Bertness | 324/426 |
| 2002/0176010 A1 | 11/2002 | Wallach et al. | 348/229.1 |
| 2003/0025481 A1 | 2/2003 | Bertness | 320/155 |
| 2003/0036909 A1 | 2/2003 | Kato | 704/275 |
| 2003/0184262 A1 | 10/2003 | Makhija | 320/130 |
| 2003/0184306 A1 | 10/2003 | Bertness et al. | 324/426 |
| 2003/0194672 A1 | 10/2003 | Roberts et al. | 431/196 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/183 |

FOREIGN PATENT DOCUMENTS

| | | |
|---|---|---|
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/62049 | 10/2000 |
| WO | WO 00/67359 | 11/2000 |
| WO | WO 01/59443 | 2/2001 |
| WO | WO 01/51947 | 7/2001 |

OTHER PUBLICATIONS

Allen Test, Testproducts Division, "Programmed Training Course for 62–000 Series Smart Engine Analyzer," 2 page cover, Table of Contents, pp. 1–207(1984).

"Notification of Transmittal of The International Search Report or the Declaration", PCT/US02/29461.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE. Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", Linear Brief 5, Mar. 1969.

Burr–Brown Corporation, "Design A 60 Hz Notch Filter with the UAF42", Jan. 1994, AB–071, 1994.

National Semiconductor Corporation, "LMF90–4$^{th}$–Order Elliptic Notch Filter", RRD–B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e–Catalog*, downloaded from http://www.pcbcafe.com, undated "Simple DC–DC Converts Allows Use of Single Battery", *Electronix Express*, downloaded from http://www.elexp.com/t_dc–dc.htm, undated.

"DC–DC Converter Basics", *Power Designers*, downloaded from http://www.powederdesigners.com/InforWeb.design_center/articles/DC–DC/converter.shtm, undated.

"Notification of Transmittal of The International Search Report or the Declaration", PCT/US03/07546.

"Notification of Transmittal of The International Search Report or the Declaration", PCT/US03/06577.

CABLE FOR ELECTRONIC BATTERY TESTER

BACKGROUND OF THE INVENTION

The present invention relates to electronic battery testers of the type used to test storage batteries. More specifically, the present invention relates to cables which are used to couple such electronic battery testers to storage batteries.

Storage batteries have long been used to provide power to various types of systems such as automobiles or as standby power sources. In order to fully utilize such batteries, it is often desirable to perform a test on the battery which provides an indication related to the condition of the battery. For example, such a test can provide an indication that a battery is weak and should be replaced, or that a battery is discharged and should be charged.

Battery tests can be as simple as a visual inspection to more complex tests such as measuring the specific gravity of acid used in the battery. A simple electronic battery test can be based upon the voltage measured across the battery. Another electronic battery test is a load test in which a load is applied to the battery and the response of the battery is observed. A less intrusive way of measuring the condition of a battery is based upon a dynamic parameter of the battery. Such a measurement technique has been pioneered by Midtronics, Inc. of Willowbrook, Ill. and Dr. Keith S. Champlin as shown and described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Ser. No. 09/703,270, filed Oct. 31, 2000, entitled ELECTRONIC BATTERY TESTER; U.S. Ser. No. 09/780,146, filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 60/379,281, filed May 8, 2002, entitled METHOD FOR DETERMINING BATTERY STATE OF CHARGE; U.S. Ser. No. 10/143,307, filed May 10, 2002, entitled ELECTRONIC BATTERY TESTER; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/270,777, filed Oct. 15, 2002, entitled PROGRAMMABLE CURRENT EXCITER FOR MEASURING AC IMMITTANCE OF CELLS AND BATTERIES; U.S. Ser. No. 10/310,515, filed Dec. 5, 2002, entitled BATTERY TEST MODULE; U.S. Ser. No. 10/310,490, filed Dec. 5, 2002, entitled ELEC- TRONIC BATTERY TESTER; U.S. Ser. No. 10/310,385, filed Dec. 5, 2002, entitled BATTERY TEST MODULE, U.S. Ser. No. 60/437,255, filed Dec. 31, 2002, entitled REMAINING TIME PREDICTIONS, U.S. Ser. No. 60/437,224, filed Dec. 31, 2002, entitled DISCHARGE VOLTAGE PREDICTIONS, U.S. Ser. No. 10/349,053, filed Jan. 22, 2003, entitled APPARATUS AND METHOD FOR PROTECTING A BATTERY FROM OVERDISCHARGE, U.S. Ser. No. 10/388,855, filed Mar. 14, 2003, entitled ELECTRONIC BATTERY TESTER WITH BATTERY FAILURE TEMPERATURE DETERMINATION, U.S. Ser. No. 10/396,550, filed Mar. 25, 2003, entitled ELECTRONIC BATTERY TESTER, U.S. Ser. No. 60/467,872, filed May 5, 2003, entitled METHOD FOR DETERMINING BATTERY STATE OF CHARGE, which are incorporated herein in their entirety.

There is an ongoing need to improve accuracy in measurements obtained using electronic battery testers.

SUMMARY OF THE INVENTION

A battery tester cable for coupling an electronic battery tester to a battery including a first clamp configured to provide a Kelvin connection to a first electrical terminals of the battery and a second clamp configured to provide a Kelvin connection to a second electrical terminals of the battery. A first cable electrically connects the first clamp to the battery and a second cable electrically connects the second clamp. A moveable cable holding device can be positioned along a length of the first and second cables to thereby secure the first and second cables together and reduce errors in battery tester measurements due to separation between the first and second cables. A method is also provided.

DETAILED DESCRIPTION OF THE PREFERRED EMBODIMENTS

Figure 1:
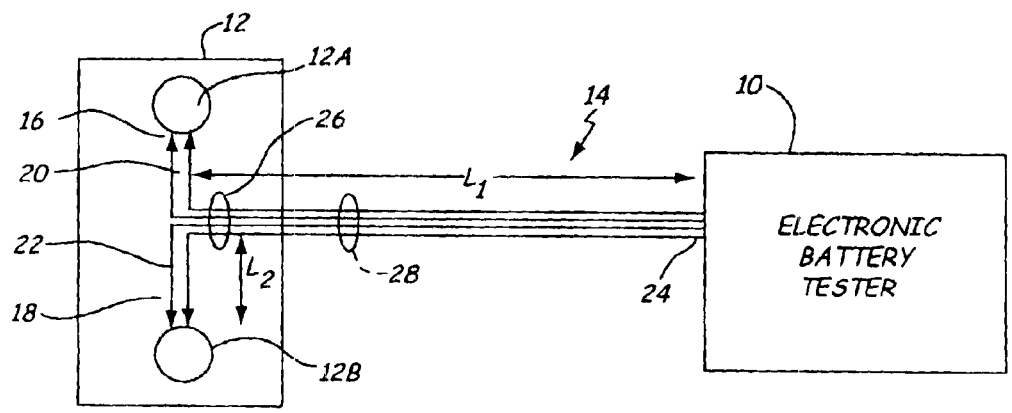
FIG. 1 is a simplified schematic diagram showing a cable for coupling an electronic battery tester to a storage battery which includes a moveable cable holding device in accordance with the present invention.

FIG. 1 is a simplified schematic diagram which shows an electronic battery tester 10 couples to a storage battery 12 through a battery tester cable 14. Electronic battery tester 10 is of the type which determines a condition of battery 12 based upon a dynamic parameter of the battery 12. The dynamic parameter is measured through Kelvin connections to terminals of the battery. The spacing between the cables which couples to the Kelvin connections can be a source of errors in dynamic parameter measurement. This is due to the relatively small signal that is being measured and/or the sensitivity of the test equipment to RF interference, changes in capacitance and inductance as the cables are moved.

Cables 14 include clamps 16 and 18 which provide Kelvin connections to electrical terminals 12A and 12B, respectively. Clamps 16 and 18 are coupled to a first cable 20 and a second cable 22 which extends between clamps 16 and 18 and a connector 24 of electronic battery tester 10. First cable 20 and second cable 22 together make up cable 14. Cables 20 and 22 may be bonded or otherwise coupled together partially along their length as they extend from connector 24. However, cables 20 and 22 separate at some point so that clamps 16 and 18 can be split apart to couple to terminals 12A and 12B of battery 12.

The present invention includes a moveable cable holding device 26 which can be positioned along the link of cable 14 to secure cables 20 and 22 together. This divides cable 14 into a length $L_1$ and $L_2$. $L_1$ is the length along which cables 20 and 22 run together. $L_2$ is the length over which cables 20 and 22 are split apart. Although this diagram shows the length $L_1$ over which cable 20 and 22 are separated as being equal, in some embodiments different links are used.

The configuration shown in FIG. 1 allows an operator to position the moveable cable holding device 26 in a manner to reduce the length $L_2$ and increase the length $L_1$. This reduces errors in battery tester measurements performed by electronic battery tester 10 due to radio frequency (RF) interference, or changes in capacitance and inductance as the cables 14 are repositioned during the testing procedure. This is required to be different size batteries and battery configurations have different spacings between the terminals. The moveable cable holding device 26 can take any appropriate configuration. For example, the moveable cable holding device 26 can be a single ring or it can be an elongate sheath which may or may not be expandable along the length of cable 14.

Any number of moveable cable holding devices can be used, as desired, for example FIG. 1 shows an optional additional moveable cable holding device 28. The moveable cable holding devices can be configured to slide along the length of cable 14 or, in some embodiments, can be completely removed from cable 14. Example cable holding devices include a ring or a loop which frictionally engages the sides of cable 14 and can slide along cable 14, a flexible loop of material which can be tightened and couple to itself using hook and loop fasteners or other attachment technique, or other configurations.

The electrical connector 24 to electronic battery tester 10 can be a plug or other removable connector, or can be an unremovable connection, for example if the cable wiring is soldered or otherwise permanently attached to electronics within battery tester 10. The cables 20 and 22 each include two individual electrical wires used to provide Kelvin connections. The two individual electrical wires that typically are electrically insulated from each other and carried in an insulating sheath.

Figure 2:
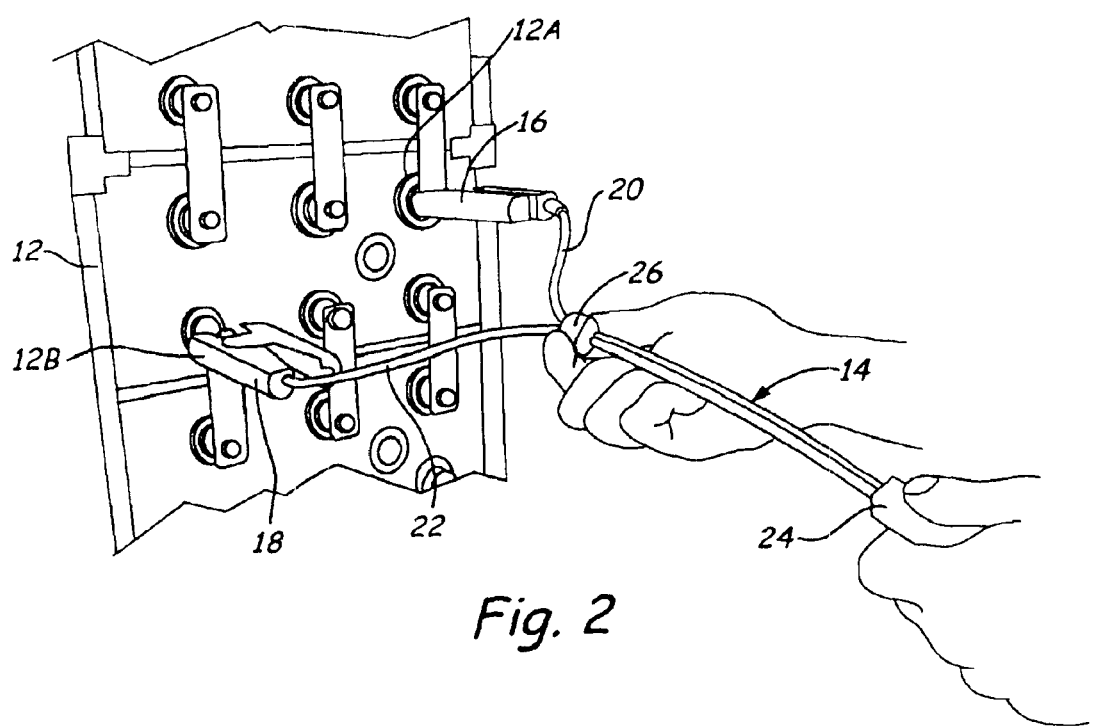
FIG. 2 is a perspective view showing the battery tester cable of FIG. 1.

FIG. 2 is a perspective view showing cable 14 coupled to battery 12. Battery 12 is illustrated as a battery within a bank of batteries configured in a manner used in standby power systems. FIG. 2 shows moveable cable holding device 26 positioned along the length of cable 14 in a manner to reduce the distance over which cable 20 and 22 are separated as they extend from electrical connector 24 to battery terminals 12A and 12B. As discussed above, all of this reduces errors in battery tester measurements performed by electronic battery tester 10 shown in FIG. 1.

Although the present invention has been described with reference to preferred embodiments, workers skilled in the art will recognize that changes may be made in form and detail without departing from the spirit and scope of the invention. The battery tester can measure a dynamic parameter of the battery using a signal which varies with time. The battery tester can be a stand alone unit or integrated with other equipment such as a battery charger. A moveable cable holding device which can be positioned along a length of the first and second cables to thereby secure the first and second cables, minimizing the separation but allowing for various test terminal spacing, and reduce errors in battery test measurements.

What is claimed is:

1. A battery tester cable for coupling an electronic battery tester to a battery, comprising:
   a first clamp configured to provide a Kelvin connection to a first electrical terminal of the battery;
   a second clamp configured to provide a Kelvin connection to a second electrical terminal of the battery;
   an electrical connection configured to electrically couple to the electronic battery tester;
   a first cable which electrically connects the first clamp to the electrical connection;
   a second cable which electrically connects the second clamp to the electrical connection; and
   a moveable cable holding device which can be positioned along a length of the first and second cables to thereby secure the first and second cables and reduce errors in battery tester measurements due to separation between the first and second cables and adjust the cables for differing battery sizes.

2. The apparatus of claim 1 wherein the moveable cable holding device comprises a loop which extends at least partially around the first and second cables.

3. The apparatus of claim 1 wherein the moveable cable holding device is slidable along the length of the first and second cables.

4. The apparatus of claim 1 wherein the first and second cables are bonded together over a portion of a length of the first and second cables.

5. The apparatus of claim 1 wherein the electrical connection is configured to electrically couple to the electronic battery tester comprises a plug.

6. The apparatus of claim 1 wherein the electrical connection is configured to electrically couple to the electronic battery tester comprises a permanent connection.

7. The apparatus of claim 1 wherein the moveable cable holding device includes a hook and loop fastener.

8. The apparatus of claim 1 wherein the movable cable holding device frictionally engages sides of the first and second cables.

9. A method of testing a battery with an electronic battery tester, comprising:
   placing a first clamp on a first terminal of the battery to provide a first Kelvin connection to the battery;
   placing a second clamp on a second terminal of the battery to provide a second Kelvin connection to the battery; and
   positioning a moveable cable holding device along a length of a first cable which electrically couples the first clamp to the battery tester and a second cable which electrically couples the second clamp to the battery tester at a position to reduce errors in measurements by the electronic battery tester due to separation between the first and second cables.

10. The method of claim 9 wherein the moveable cable holding device comprises a loop which extends at least partially around the first and second cables.

11. The method of claim 9 wherein the moveable cable holding device is slidable along the length of the first and second cables.

12. The method of claim 9 wherein the first and second cables are bonded together over a portion of a length of the first and second cables.

13. The method of claim 9 wherein the electrical connector configured to electrically couple to the electronic battery tester comprises a plug.

14. The method of claim 9 wherein the moveable cable holding device includes a hook and loop fastener.

15. The method of claim 9 wherein the movable cable holding device frictionally engages sides of the first and second cables.

* * * * *